(12) United States Patent
Haputhanthri et al.

(10) Patent No.: US 11,697,355 B2
(45) Date of Patent: Jul. 11, 2023

(54) ELECTRIFIED VEHICLE ELECTRICAL DISTRIBUTION SYSTEM COMPONENT PROTECTION SYSTEMS AND METHODS

(71) Applicant: Ford Global Technologies, LLC, Dearborn, MI (US)

(72) Inventors: Shehan Haputhanthri, Canton, MI (US); Seth Anthony Bryan, Royal Oak, MI (US); Joseph Gerald Supina, Saline, MI (US); Shunsuke Okubo, Belleville, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 856 days.

(21) Appl. No.: 16/109,134

(22) Filed: Aug. 22, 2018

(65) Prior Publication Data

US 2020/0062124 A1 Feb. 27, 2020

(51) Int. Cl.
| | | |
|---|---|---|
| *B60L 58/12* | (2019.01) | |
| *B60L 58/24* | (2019.01) | |
| *H01M 10/48* | (2006.01) | |
| *G01R 31/382* | (2019.01) | |
| *H02J 7/00* | (2006.01) | |
| *H02J 7/14* | (2006.01) | |

(52) U.S. Cl.
CPC .............. *B60L 58/12* (2019.02); *B60L 58/24* (2019.02); *G01R 31/382* (2019.01); *H01M 10/486* (2013.01); *H02J 7/00714* (2020.01); *H02J 7/007182* (2020.01); *H02J 7/007194* (2020.01); *B60L 2240/545* (2013.01); *B60L 2240/549* (2013.01); *H01M 2220/20* (2013.01); *H02J 7/1423* (2013.01); *H02J 2310/48* (2020.01)

(58) Field of Classification Search
CPC .............. H02J 7/0047; H02J 7/007182; H02J 7/00714; H02J 7/007194; H02J 7/007192; H02J 7/0021; H02J 7/045; H02J 7/0091; G01R 31/382; H01M 10/486; B60L 58/24; B60L 58/12
USPC .......................................... 320/150, 134, 136
See application file for complete search history.

(56) References Cited

U.S. PATENT DOCUMENTS

| | | | | |
|---|---|---|---|---|
| 5,561,360 A | * | 10/1996 | Ayres ................... | H02J 7/00711 320/129 |
| 5,880,947 A | * | 3/1999 | Imanaka ............. | H02M 1/4233 363/89 |
| 5,889,385 A | * | 3/1999 | Podrazhansky ...... | H02J 7/00711 320/130 |
| 6,532,941 B2 | * | 3/2003 | Begley ................ | F02D 41/3082 123/497 |
| 7,514,905 B2 | | 4/2009 | Kawahara et al. | |

(Continued)

FOREIGN PATENT DOCUMENTS

JP 2010083319 A * 4/2010

*Primary Examiner* — John T Trischler
(74) *Attorney, Agent, or Firm* — David B. Kelley; Brooks Kushman P.C.

(57) ABSTRACT

A vehicle includes an electrified propulsion system powered by a traction battery over an electrical distribution system (EDS) and a controller programmed to monitor at least one of a current flow and a temperature at a plurality of locations throughout the EDS. The controller is also programmed to implement at least one mitigation action over a predetermined time window in response to detecting a filtered current value exceeding a threshold.

20 Claims, 10 Drawing Sheets

(56) References Cited

U.S. PATENT DOCUMENTS

| | | | | |
|---|---|---|---|---|
| 8,335,062 B2* | 12/2012 | Haines | | H02H 3/00 |
| | | | | 361/42 |
| 8,384,351 B2* | 2/2013 | Monden | | H02J 7/0014 |
| | | | | 320/116 |
| 8,405,939 B2* | 3/2013 | Haines | | H02H 9/00 |
| | | | | 361/42 |
| 8,564,241 B2 | 10/2013 | Masuda | | |
| 8,624,559 B2* | 1/2014 | Syed | | H01M 10/48 |
| | | | | 320/162 |
| 8,624,560 B2 | 1/2014 | Ungar et al. | | |
| 9,018,878 B2* | 4/2015 | Hendrickson | | B60L 3/12 |
| | | | | 318/461 |
| 9,902,277 B2 | 2/2018 | Keller et al. | | |
| 9,948,087 B2* | 4/2018 | Haines | | H02H 3/16 |
| 10,160,342 B2* | 12/2018 | Baraszu | | B60L 11/1864 |
| 10,232,732 B2* | 3/2019 | Perkins | | B60L 58/26 |
| 10,319,360 B1* | 6/2019 | He | | G10K 11/175 |
| 2001/0028571 A1* | 10/2001 | Hanada | | H02J 7/345 |
| | | | | 363/50 |
| 2004/0001278 A1* | 1/2004 | Andress | | G11B 5/5521 |
| | | | | 360/78.06 |
| 2009/0091297 A1* | 4/2009 | Ishikawa | | H02J 7/0021 |
| | | | | 320/134 |
| 2011/0216451 A1* | 9/2011 | Haines | | B60L 53/16 |
| | | | | 361/42 |
| 2011/0216452 A1* | 9/2011 | Haines | | H02H 3/00 |
| | | | | 361/42 |
| 2011/0216453 A1* | 9/2011 | Haines | | H02H 9/00 |
| | | | | 361/49 |
| 2012/0091971 A1* | 4/2012 | Syed | | H01M 10/48 |
| | | | | 320/162 |
| 2013/0063079 A1* | 3/2013 | Kawai | | H02J 7/045 |
| | | | | 320/107 |
| 2013/0271148 A1* | 10/2013 | Maeda | | B60L 58/13 |
| | | | | 324/426 |
| 2014/0021898 A1* | 1/2014 | Hendrickson | | B60L 7/06 |
| | | | | 318/434 |
| 2014/0254050 A1* | 9/2014 | Haines | | H02H 3/162 |
| | | | | 361/42 |
| 2016/0116548 A1* | 4/2016 | Ghantous | | H01M 10/425 |
| | | | | 702/63 |
| 2016/0214502 A1* | 7/2016 | Perkins | | H02J 7/0021 |
| 2017/0054286 A9* | 2/2017 | Haines | | G01R 31/50 |
| 2017/0054316 A1 | 2/2017 | Francis-Buller | | |
| 2017/0282746 A1* | 10/2017 | Baraszu | | B60L 11/1864 |
| 2018/0115264 A1* | 4/2018 | Hano | | H02P 6/28 |
| 2018/0358916 A1* | 12/2018 | Son | | G10K 9/12 |
| 2019/0316527 A1* | 10/2019 | Kinoshita | | F02D 9/02 |

* cited by examiner

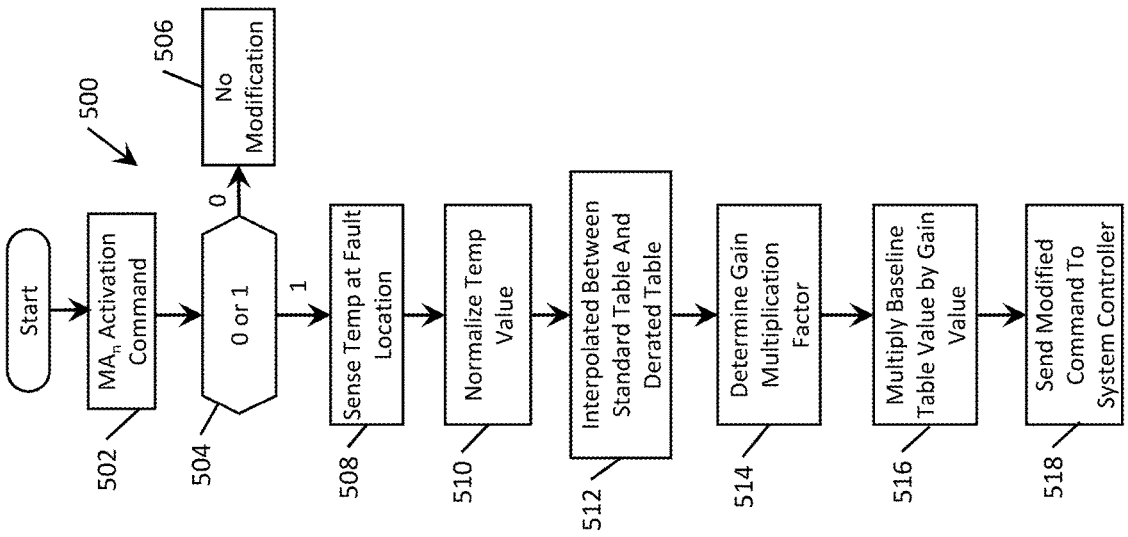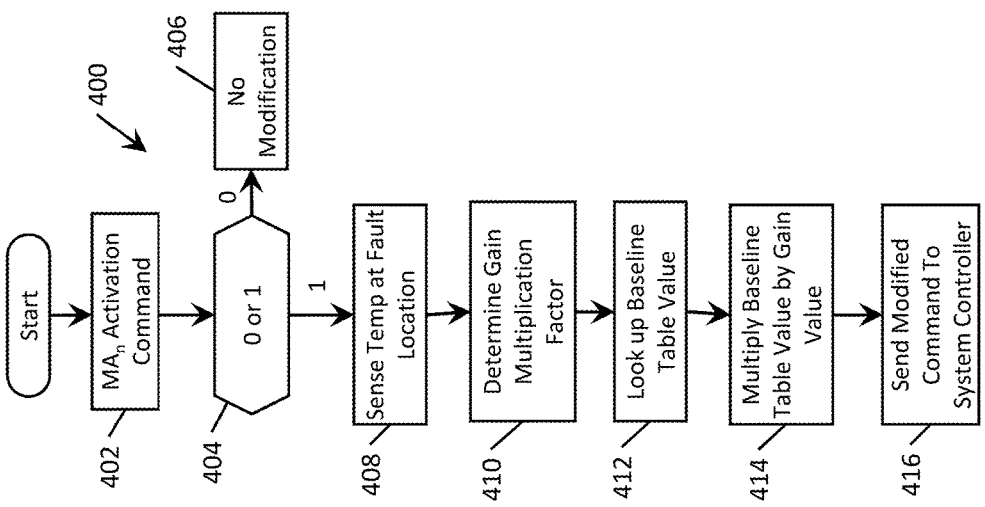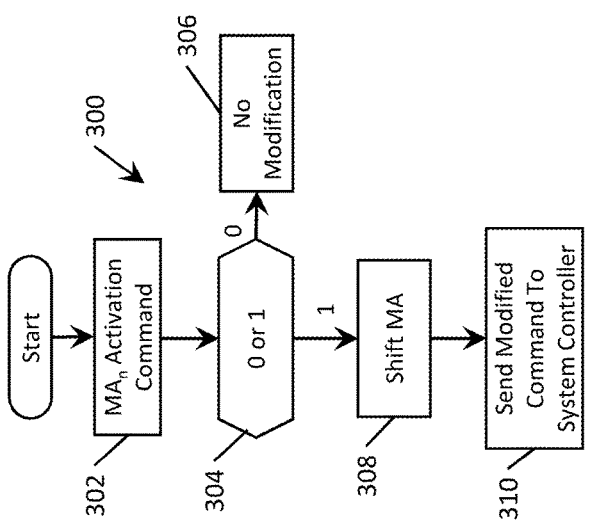

ELECTRIFIED VEHICLE ELECTRICAL DISTRIBUTION SYSTEM COMPONENT PROTECTION SYSTEMS AND METHODS

TECHNICAL FIELD

The present disclosure relates to electrically powered component protection systems for electrified vehicles.

BACKGROUND

Powertrain electrification is used by automakers to improve fuel economy. These systems can have higher electrical ratings and a use a number of high and low voltage components. To minimize the cost of production these components are often sized as small as possible and still cover a majority of the customer use cases. Certain severe use cases might overload one or more electrical components. Overloading may result in overtemperature and permanent damage to the components. Associated part failures may cause increased warranty costs. Additionally, it may be desirable to reuse component designs from previous vehicle programs, as opposed to redesigning electrical ratings of every component for each new vehicle.

SUMMARY

A vehicle includes an electrified propulsion system powered by a traction battery over an electrical distribution system (EDS) and a controller programmed to monitor at least one of a current flow and a temperature at a plurality of locations throughout the EDS. The controller is also programmed to implement at least one mitigation action over a predetermined time window in response to detecting a filtered value of current squared exceeding a threshold. In additional examples, a mitigation action may be triggered by any of a monitored current root mean squared (RMS) value, a monitored temperature value, and a non-squared filtered current value.

A method of controlling power flow in a vehicle electrical distribution system (EDS) includes monitoring current at a first selected component within the EDS. The method also includes enabling a set of mitigation actions to maintain the current at the first selected component less than a control percentage threshold of a current limit in response to the monitored current exceeding the current limit. The current limit is selected based on a current carrying capability of the EDS. In a specific example, the current carrying capability of the EDS is driven by a second current-limiting component within the EDS, which may be the weakest component along a monitored current flow path.

A vehicle includes an electric machine powered over an electrical distribution system (EDS) in cooperation with an engine. The vehicle also includes a controller programmed to cause propulsion of the vehicle using at least one of the electric machine and the engine and monitor filtered current across the EDS. The controller is further programmed to enable at least one mitigation action to reduce electric machine output and satisfy a driver demand by increasing engine output in response to sensing a filtered value of squared current greater than a threshold. In additional examples, a mitigation action may be triggered by any of a monitored current root mean squared (RMS) value, a monitored temperature value, and a non-squared filtered current value.

BRIEF DESCRIPTION OF THE DRAWINGS

FIG. 3 is a flowchart of a first algorithm to modify an electrical mitigating action.

FIG. 4 is a flowchart of a second algorithm to modify an electrical mitigating action.

FIG. 5 is a flowchart of a third algorithm to modify an electrical mitigating action.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The present disclosure relates to a software control strategy which monitors the current and/or temperature components in electrical distribution system (EDS) paths. The control strategy enables mitigation actions if an over-current or over-temperature condition is about to happen in the weakest member of the EDS. As discussed below, temperature could be a direct measurement from a temperature sensor. Alternatively, temperature could be estimated using RMS and/or filtered current readings. Additionally, various system signals indicative of potential damage to components may be monitored over multiple different selectable time windows. Mitigation actions are enabled in response to the detection of a sensed temperature and/or current approaching the limit of weakest component in the EDS. Mitigation actions are activated in according to pre-determined rank based on efficacy of managing current flow at the location of sensed EDS disturbance. The mitigation actions are also ranked in an order that reduces the current though the components as much as possible while minimally reducing the fuel economy.

Figure 1:
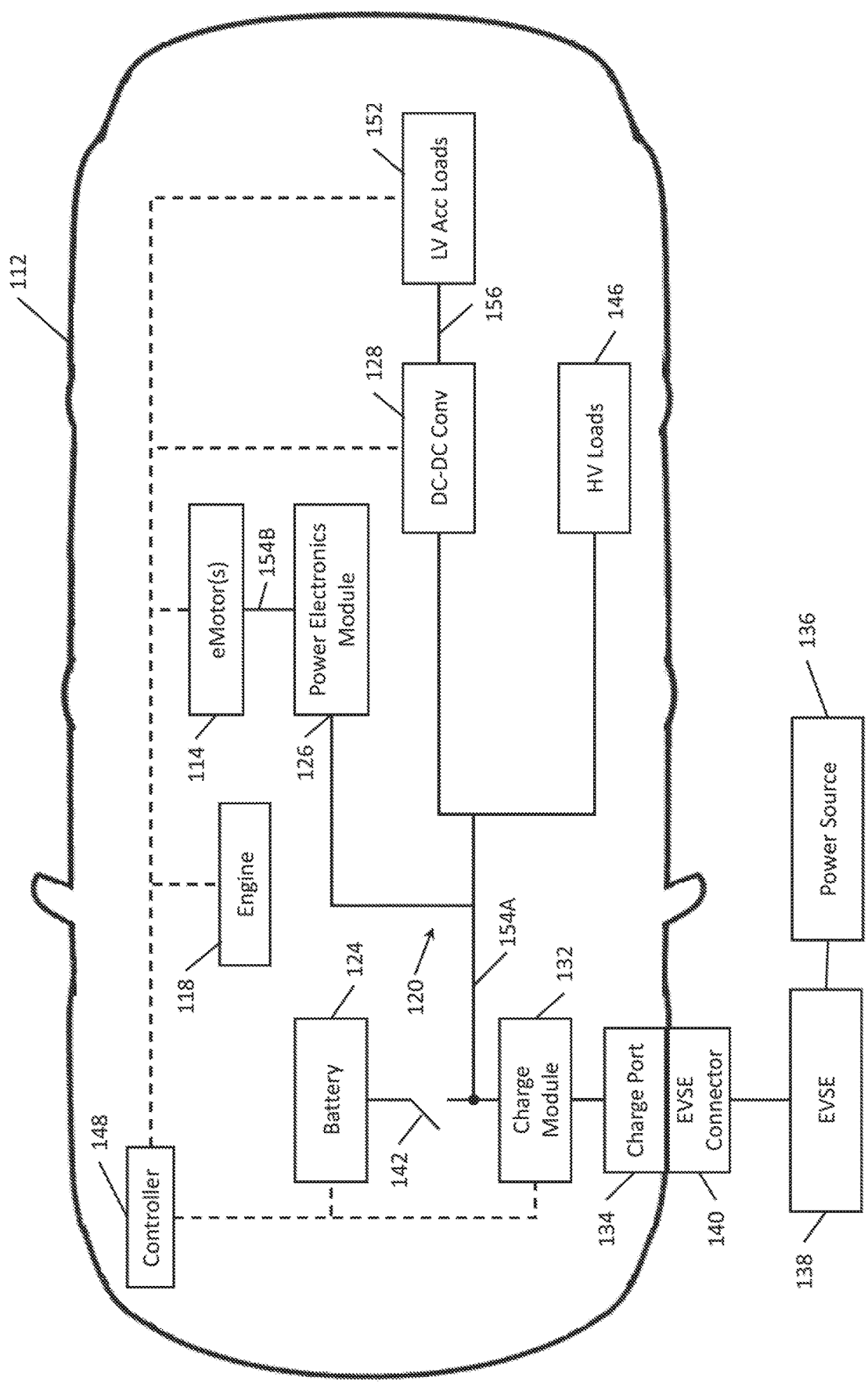
FIG. 1 is a vehicle having electrically-powered components.

FIG. 1 depicts a hybrid-electric vehicle (HEV) 112. The HEV 112 includes an electrified propulsion system having one or more electric machines 114 mechanically coupled to a hybrid transmission (not shown). The electric machines 114 may be capable of operating as a motor or a generator. In addition, the hybrid transmission is mechanically coupled to an internal combustion engine 118 (i.e., ICE). The electric machines 114 are arranged to provide propulsion torque as well as deceleration torque capability either while the engine 118 is operated or turned off. The electric machines 114 are capable of operating as generators to provide fuel economy benefits by recovering energy that would normally be lost as heat in a friction braking system. The electric machines 114 may additionally impart a reaction torque against the engine output torque to generate electricity for recharging a traction battery the while the vehicle is operating. The electric machines 114 may further reduce vehicle emissions by allowing the engine 118 to operate near the most efficient speed and torque ranges. When the engine 118 is off, the HEV 112 may be operated in an electric-only drive mode using the electric machines 114 as the sole source of propulsion. The hybrid transmission is also mechanically coupled to road wheels to output torque from the electric machines 114 and/or combustion engine 118.

A traction battery or battery pack 124 stores energy that can be used to power the electric machines 114. The battery pack 124 typically provides a high-voltage direct current (DC) output for distribution throughout EDS 120. One or more contactors 142 may isolate the traction battery 124 from a DC high-voltage bus 154A within the EDS 120 when opened and couple the traction battery 124 to the DC high-voltage bus 154A when closed. The traction battery 124 is electrically coupled to one or more power electronics modules 126 via the DC high-voltage bus 154A. The power electronics module 126 is also electrically coupled to the electric machines 114 and provides the ability to bi-directionally transfer energy within the EDS 120 between AC high-voltage bus 154B and the electric machines 114. According to some examples, the traction battery 124 may provide a DC current while the electric machines 114 operate using a three-phase alternating current (AC). The power electronics module 126 may convert the DC current to a three-phase AC current to operate the electric machines 114. In a regenerative mode, the power electronics module 126 may convert the three-phase AC current output from the electric machines 114 acting as generators to DC current compatible with the traction battery 124. The description herein is equally applicable to an all-electric vehicle without a combustion engine.

In addition to providing energy for propulsion, the traction battery 124 may provide energy for other vehicle electrical systems. The vehicle 112 may include a DC/DC converter module 128 that is electrically coupled to the high-voltage bus 154. The DC/DC converter module 128 may be electrically coupled to a low-voltage bus 156. The DC/DC converter module 128 may convert the high-voltage DC output of the traction battery 124 to a low-voltage DC supply that is compatible with low-voltage vehicle loads 152. The low-voltage bus 156 may be electrically coupled to an auxiliary battery 130 (e.g., 12V battery). The low-voltage loads 152 may be electrically coupled to the low-voltage bus 156. The low-voltage loads 152 may include various controllers within the vehicle 112.

The traction battery 124 of vehicle 112 may be recharged by an off-board power source 136. The off-board power source 136 may be a connection to an electrical outlet. The external power source 136 may be electrically coupled to a charger or another type of electric vehicle supply equipment (EVSE) 138. The off-board power source 136 may be an electrical power distribution network or grid as provided by an electric utility company. The EVSE 138 provides circuitry and controls to regulate and manage the transfer of energy between the power source 136 and the vehicle 112. The off-board power source 136 may provide DC or AC electric power to the EVSE 138. The EVSE 138 includes a charge connector 140 for plugging into a charge port 134 of the vehicle 112. The charge port 134 may be any type of port configured to transfer power from the EVSE 138 to the vehicle 112. The charge port 134 may be electrically coupled to a charge module or on-board power conversion module 132. The power conversion module 132 conditions power supplied from the EVSE 138 to provide the proper voltage and current levels to the traction battery 124. The power conversion module 132 interfaces with the EVSE 138 to coordinate the delivery of power to the vehicle 112. The EVSE connector 140 may have pins that mate with corresponding recesses of the charge port 134. Alternatively, various components described as being electrically coupled or connected may transfer power using wireless inductive coupling or other non-contact power transfer mechanisms. The charge components including the charge port 134, power conversion module 132, power electronics module 126, and DC-DC converter module 128 may collectively be considered part of a power interface system configured to receive power from the off-board power source 136.

When the vehicle 112 is plugged in to the EVSE 138, the contactors 142 may be in a closed state so that the traction battery 124 is coupled to the high-voltage bus 154 and to the power source 136 to charge the battery. The vehicle may be in the ignition-off condition when plugged in to the EVSE 138.

One or more wheel brakes (not shown) may be provided as part of a braking system to decelerate the vehicle 112 and prevent motion of the vehicle wheels. The brakes may be hydraulically actuated, electrically actuated, or some combination thereof. The brake system may also include other components to operate the wheel brakes. The brake system may include a controller to monitor and coordinate operation. The controller monitors the brake system components and controls the wheel brakes 144 for vehicle deceleration. The brake system also responds to driver commands via a brake pedal input and may also operate to automatically implement features such as stability control. The controller of the brake system may implement a method of applying a requested brake force when requested by another controller or sub-function.

One or more high-voltage electrical loads 146 may be coupled to the high-voltage bus 154. The high-voltage electrical loads 146 may have an associated controller that operates and controls the high-voltage electrical loads 146 when appropriate. The high-voltage loads 146 may include components such as compressors and electric heaters. According to a specific example, a vehicle air conditioning system may draw as much as 6 kW under high cooling loads.

The various components discussed may have one or more associated controllers to control, monitor, and coordinate the operation of the components. The controllers may communicate via a serial bus (e.g., Controller Area Network (CAN)) or via discrete conductors. In addition, a vehicle system controller 148 may be provided to coordinate the operation of the various components.

System controller 148, although represented as a single controller, may be implemented as one or more controllers. The controller 148 may monitor operating conditions of the various vehicle components. According to the example of FIG. 1, at least the electric machines 114, engine 118, traction battery 124, DC-DC converter 128, charging module 132, and high-voltage loads 146, and low-voltage loads 152 are in communication with the controller 148. The traction battery 124 also includes a current sensor to sense current that flows through the traction battery 124. The traction battery 124 also includes a voltage sensor to sense a voltage across terminals of the traction battery 124. The voltage sensor outputs a signal indicative of the voltage across the terminals of the traction battery 124. The traction battery current sensor outputs a signal indicative of a magnitude and direction of current flowing into or out of the traction battery 124.

The charging module 132 also includes a current sensor to sense current that flows from the EVSE 138 to the traction battery 124. The engine 118 coupled to the electric machine 114 generates an AC current that is converted to a DC current by the power electronics module 126. The engine 118 may be controlled by a powertrain control module having at least one controller in connection with the system controller 148. The current sensor of the charging module 132 outputs a signal indicative of a magnitude and direction of current flowing from the EVSE 138 to the traction battery 124.

The current sensor and voltage sensor outputs of the traction battery 124 are provided to the controller 148. The controller 148 may be programmed to compute a state of charge (SOC) based on the signals from the current sensor and the voltage sensor of the traction battery 124. Various techniques may be utilized to compute the state of charge. For example, an ampere-hour integration may be implemented in which the current through the traction battery 124 is integrated over time. The SOC may also be estimated based on the output of the traction battery voltage sensor 104. The specific technique utilized may depend upon the chemical composition and characteristics of the particular battery.

The controller 148 may also be configured to monitor the status of the traction battery 124. The controller 148 includes at least one processor that controls at least some portion of the operation of the controller 148. The processor allows onboard processing of commands and executes any number of predetermined routines. The processor may be coupled to non-persistent storage and persistent storage. In an illustrative configuration, the non-persistent storage is random access memory (RAM) and the persistent storage is flash memory. In general, persistent (non-transitory) storage can include all forms of storage that maintain data when a computer or other device is powered down.

A desired SOC operating range may be defined for the traction battery 124. The operating ranges may define an upper and lower limit at which the SOC of the battery 124 is bounded. During vehicle operation, the controller 148 may be configured to maintain the SOC of the battery 124 within the desired operating range. In this regard, the battery may be recharged by the engine while the vehicle is in operation. In other cases, the battery is recharged when at rest and connected to an off-board power source. Based on a rate of battery depletion and/or recharge, charging of the traction battery may be scheduled in advance based on approaching an SOC low threshold. The timing and rate of recharging may also be opportunistically selected to maintain voltage and SOC within predetermined ranges to avoid battery damage.

Figure 2:
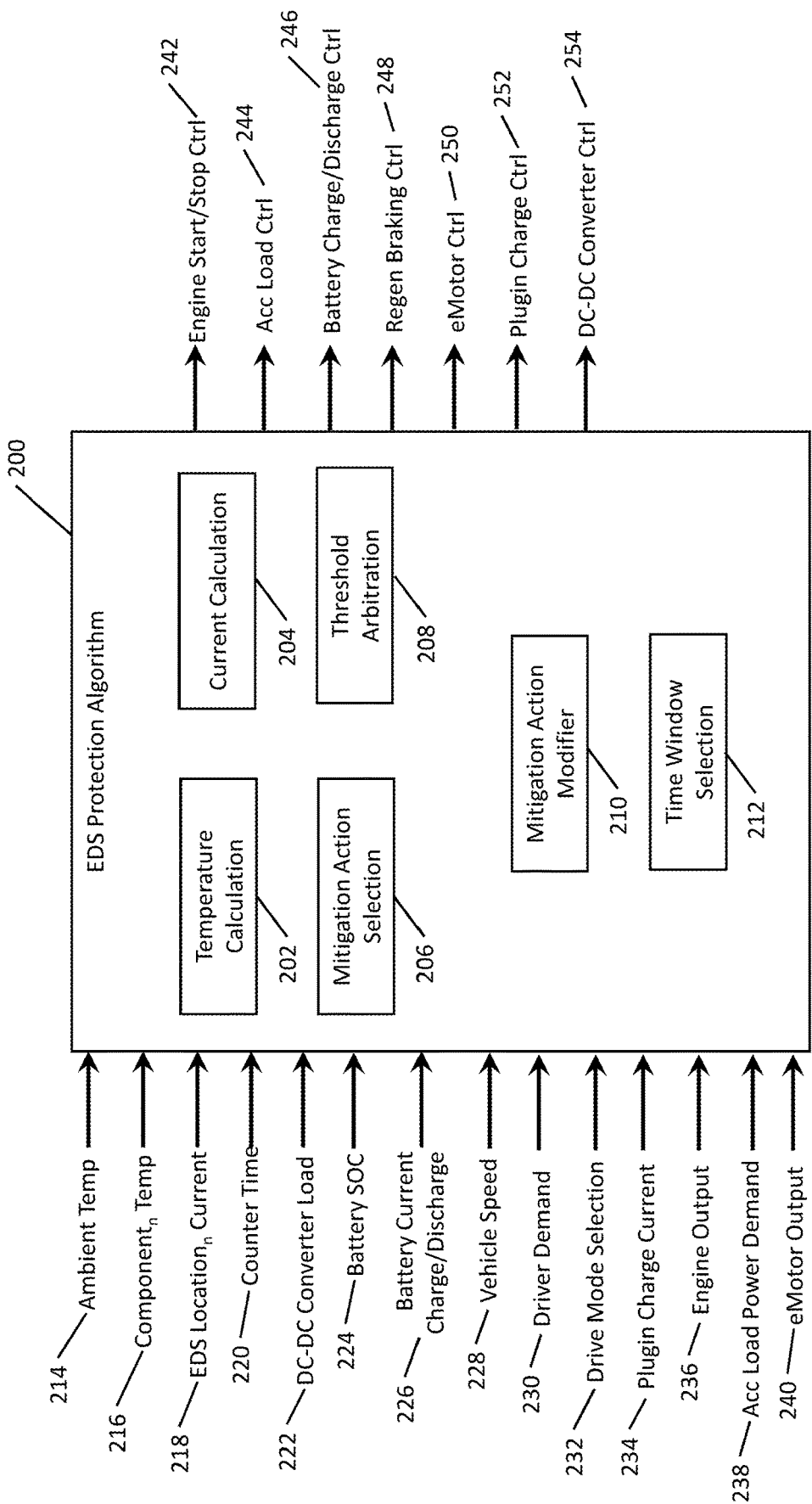
FIG. 2 is a system diagram of an electrical distribution system.

FIG. 2 includes system schematic of an electric distribution system (EDS) protection algorithm 200 according to aspects of the present disclosure. The algorithm 200 may include any of a number of subroutines, each arranged to manage various portions of electrical component protection. The algorithm 200 may include, for example, a temperature calculation subroutine 202, a current calculation subroutine 204, a mitigation action selection subroutine 206, a threshold arbitration subroutine 208, a migration action modifier subroutine 210, and a time window selection subroutine 212. While each of the example subroutines are depicted as discrete, the functions performed by each subroutine may have overlap when implemented in practice. That is, according to some aspects of the present disclosure an overarching algorithm is configured to selectively perform the entirety or portions thereof each of a plurality of subroutines related to EDS component protection. In this example, the EDS includes the electric machines 114, traction battery 124, power electronics module 126, DC/DC converter module 128, power conversion module 132, high-voltage electrical loads 146, low-voltage vehicle loads 152, and the connections therebetween.

The vehicle controller, such as controller 148, assigned to perform EDS protection algorithm 200 receives input signals from a number of vehicle components. The vehicle includes at least one temperature sensor configured to output signal 214 indicative of an ambient temperature. Additional temperature sensors may also be provided to output at least one signal 216 indicative of a temperature of a EDS component or point along the EDS circuit. The vehicle also includes at least one current sensor to output a current signal 218 corresponding to a current flowing through a particular EDS component and/or at a location along the EDS circuit. The vehicle also includes a counter to output a time signal 220 indicative of an elapsed time from a particular reference starting point. The vehicle further includes a voltage sensor to output a DC-DC converter load signal 222 indicative of the amount of voltage step provided by the DC-DC converter. The vehicle also includes a sensor disposed at the high-voltage battery arranged to output a battery SOC signal 224 indicative of SOC. The vehicle further includes a current sensor at the high-voltage battery arranged to output a charge/discharge signal 226 indicative of an electrical current flowing to or from the battery. The vehicle further includes a speedometer to output a vehicle speed signal 228. The vehicle further includes an accelerator sensor arranged to driver demand signal 230 indicative of a driver propulsion request. According to some examples the driver demand signal 230 is based on an accelerator pedal angular tip in position. The vehicle further includes a user interface that allows driver input to select a drive mode, for example such as economy drive mode, performance drive mode, or other modes which vary vehicle operating conditions. The user interface outputs a drive mode selection signal 232 indicative of a driver selection of a drive mode. If equipped as a PHEV, the vehicle further includes at least one current sensor near the charge port to output a plugin charge current signal 234 indicative of current flowing through the charge port. The vehicle includes at least one sensor at the engine arranged to output an engine output signal 236 indicative of engine output, for example, such as engine torque and/or RPM. The vehicle further includes at least one sensor to output accessory load power demand signal 238 indicative of the electrical demand of any of the vehicle electrical accessories, such as air conditioner. The vehicle further includes a sensor at the electric machine to output at least one signal indicative of output of the electric machine, whether operating as a motor or as a generator.

The EDS protection algorithm 200 also is adapted to output a plurality of command signals to influence electrical behavior across the EDS. For example, the algorithm is configured to selectively output an engine start-stop signal 242 to command an operating state of the engine. The algorithm is also configured to output a vehicle accessory load control signal 244 to manage allowed loads of any of the vehicle electrical accessories. the algorithm is further configured to output at least one battery charge-discharge control signal 246 to regulate the amount of current supplied to the battery for charging or discharged from the battery to power vehicle components. The algorithm 200 is further configured to output a regenerative braking control signal 248 to regulate how much power is generated by the regenerative braking system. The algorithm 200 is further configured to output an electric machine control signal 250 to regulate the behavior of the electric machine(s). The algorithm is further configured to output a plug-in charge control signal 252 to regulate the amount of charge supplied to the vehicle from the EVSE. The algorithm 200 is further configured to output a DC-DC converter control signal 254 to regulate the degree of voltage step up or step down performed by the DC-DC converter.

With continued reference to FIG. 2, EDS protection algorithm 200 includes a temperature calculation subroutine 202: According to some examples, temperature estimation may be performed using a direct temperature signal input. Alternatively, the relationship between electrical current and EDS component temperature could be analytically derived in a closed form solution by considering the physics of an electrical component and electrical distribution system.

With reference to one example temperature estimation equation, there are four main contributors to temperature fluctuation associated with power flow to a given component in the EDS. Equation (1) below depicts one relationship between these contributors.

$$T(t) = \frac{T_{0,amb} + T_{t,amb}}{2} + \Delta T_{Elec} + \Delta T_{Friction} - \Delta T_{Cooling} \quad (1)$$

In equation (1) above, T(t) represents the EDS component temperature at time t, $T_{0,amb}$ represents the initial ambient temperature, and $T_{t,amb}$ represents ambient temperature at time t. Additionally, $\Delta T_{Elec}$ represents the temperature rise due to current moment (i.e., copper losses), $\Delta T_{Friction}$ represents temperature rise due to vibration (i.e., friction heating), and $\Delta T_{Cooling}$ represents temperature decrease due to convention cooling. Each of $\Delta T_{Elec}$, $\Delta T_{Friction}$, and $\Delta T_{Cooling}$ may be estimated using equations (2), (3), and (4) below, respectively $$\Delta T_{Elec} = \frac{R \sum_{n=0}^{N} I_n^2 \Delta t_n}{m * C_p} \quad (2)$$

Referring to equation (2) above, R represents electrical resistance, $I_n^2$ represents the square of the current applied over a segment n, and $\Delta t_n$ represents the duration of time over which the current is applied.

$$\Delta T_{Friction} = \frac{\mu_k \sum_{m=0}^{M} F_{n(m)} v_m \Delta t_m}{m * C_p} \quad (3)$$

$$\Delta T_{Cooling} = \frac{hA \sum_{n=0}^{N} (T_t - T_{t,amb})_n \Delta t_n}{m * C_p} \quad (4)$$

$$T(t) = \frac{T_{0,amb} + T_{t,amb}}{2} + \frac{1}{m * C_p} * \left( R \sum_{n=0}^{N} I_n^2 \Delta t_n + \mu_k \sum_{m=0}^{M} F_{n(m)} v_m \Delta t_m - hA \sum_{n=0}^{N} (T_t - T_{t,amb})_n \Delta t_n \right) \quad (5)$$

As discussed in more detail below, a prediction of the rate of temperature rise may aid in the selection of an appropriate time window over which to analyze and apply a mitigation action to limit current to protect one or more EDS devices. In some cases, there may be practical limitations to a full parameterization of the temperature estimation equations. Accordingly, it may require significant experimentation to achieve correlation, and the parameters may be vehicle-specific and not applicable to a range of vehicles. Therefore, one practical alternative would be to focus on the temperature rise of a particular EDS component based on the current delivered to the particular component, and define limits for the current carrying capability of that component. According to some examples, the filtered value of the squared current measurement is indicative of temperature fluctuations, and thus may be used as a surrogate for temperature measurement. In additional examples, a mitigation action may be triggered by any of a monitored current root mean squared (RMS) value, a monitored direct measurement temperature value, and a non-squared filtered current value.

A number of different mitigation actions may be selected and implemented either individually, or in combination, to protect EDS devices from electrical fault conditions. According to a first example mitigation action, the EDS protection algorithm includes modifying the traction battery SOC engine pull up threshold based on an engine pull-up table for driver demanded power. That is, the table may dictate the driver demanded power at which the engine is pulled up (i.e., switched on) based on the available SOC in the traction battery and the current vehicle speed. When this first mitigation action is implemented, the engine is pulled up at a lower driver demanded power relative to baseline power demand threshold to reduce electrical load at a desired location in the EDS. Accordingly, the driver demanded power is satisfied using the engine and the load on the traction motor and battery is reduced. This in return reduces the current flowing through the high voltage EDS. In at least one example, the vehicle controller is programmed to decrease a driver power demand engine pull up threshold in response to detection of an overcurrent or an over temperature condition.

According to a second example mitigation action, the EDS protection algorithm includes modifying the traction battery SOC engine pull down threshold based on an engine pull-down table for driver demanded power. That is, the table may dictate the driver demanded power at which the engine is pulled down (i.e., switched off) based on the available SOC in the traction battery and the current vehicle speed. When this second mitigation action is implemented, the engine is pulled down at a lower driver demanded power. The effect is that the driver demanded power is supported through the engine for a longer time and the load on the traction motor and battery is reduced. This in return reduces the current flowing through the high voltage EDS. In at least one example, the vehicle controller is programmed to decrease a driver power demand engine pull down threshold in response to detection of an overcurrent or an over temperature condition.

According to a third example mitigation action, the EDS protection algorithm includes modifying a power discharge limit of the traction battery based on an engine pull-up table for driver demanded power. In this example, the table dictates the driver demanded power at which the engine is pulled up based on the current allowed according to a discharge power limit from the traction battery and the current vehicle speed. When this mitigation action is implemented, the engine is pulled up at a lower driver demanded power based on the power discharge limit from the battery. Then the driver demanded power is satisfied using the engine and the load on the traction motor is reduced. This in return reduces the current flowing through the high voltage EDS.

According to a fourth example mitigation action, the EDS protection algorithm includes modifying the power discharge limit of the traction battery based on an engine pull-down table for driver demanded power. In this example, the table dictates the driver demanded power at which the engine is pulled down based on the current allowed according to the discharge power limit from the traction battery and the current vehicle speed. When this mitigation action is implemented, the engine is pulled down at a lower driver demanded power. Accordingly, the driver demanded power is satisfied using the engine for a longer time and the load on the traction motor is reduced. This in return reduces the current flowing through the high voltage EDS.

According to a fifth example mitigation action, the EDS protection algorithm includes reducing an overall traction battery discharge power limit. The discharge power limit of the traction battery governs the maximum discharge limit of the battery for given set of conditions. When this overall limit is reduced, maximum power delivered from the battery is reduced, lowering the current flowing through the high voltage EDS. In at least one example, the vehicle controller is programmed to decrease a traction battery discharge power limit in response to detection of an overcurrent or an over temperature condition.

According to a sixth example mitigation action, the EDS protection algorithm includes reducing an overall traction battery charge power limit. The charge power limit of the traction battery governs the maximum charge limit of the battery when charged from regenerative breaking, from an external power source, or when supplying recharge using engine power. When this overall charge limit is reduced, power flowing in to the traction battery is reduced, lowering the current flowing through the high voltage EDS. In at least one example, the vehicle controller is programmed to decrease a traction battery charge power limit in response to detection of an overcurrent or an over temperature condition.

According to a seventh example mitigation action, the EDS protection algorithm includes reducing regenerative braking torque and/or power limits. Regenerative braking controls govern the maximum torque limit and/or power limit allowed during power regeneration. When these two limits are reduced, energy captured by regenerative braking reduced and thus excess energy is dissipated through the friction brakes. This reduces the current carried out in the high voltage EDS. In at least one example, the vehicle controller is programmed to decrease a regenerative braking power limit in response to detection of an overcurrent or an over temperature condition.

According to an eighth example mitigation action, the EDS protection algorithm includes reducing the EV mode maximum driving speed. Higher driving speeds in EV mode demand higher power from the traction motor and battery. When the maximum allowed EV mode driving speed is reduced, the engine is pulled up to supplement propulsion if the vehicle is driven over this threshold speed. When implemented, this mitigation action regulates the current delivered from the traction battery in to the high voltage EDS. In at least one example, the vehicle controller is programmed to reduce an EV mode maximum driving speed in response to detection of an overcurrent or an over temperature condition.

According to a ninth example mitigation action, the EDS protection algorithm includes disabling selectable drive modes that require more electric drive. In effect, this mitigation action may cause a forced exit of certain EV mode operations. Thus, if the vehicle is operated in a drive mode which requires more electric drive, the mitigation action may cause the drive mode to be forcibly stopped. The mitigation action may further include shifting the operating mode to a conventional mode requiring less EV propulsion. This would reduce the currents passing through the EDS. In some examples, the vehicle controller is programmed to disable an EV propulsion mode in response to detection of an overcurrent or an over temperature condition. In some other examples, the controller may be programmed to enable a mitigation action having a derated operation of the electric machine.

According to a tenth example mitigation action, the EDS protection algorithm includes expanding allowable NVH (noise, vibration, and harshness) thresholds. NVH thresholds are generally defined to operate the vehicle as smooth as possible. Standard NVH thresholds may be arranged to prevent the engine switching on and maximize running the vehicle in EV mode as far possible. When this example mitigation action is implemented, the NVH thresholds are reduced to allow more non-electric operation at the cost of increased NVH. This in turn reduces the loads on the electrical machines and currents passing through in the high voltage EDS.

According to an eleventh example mitigation action, the EDS protection algorithm includes forcing engine-on operation (e.g., forced Hybrid drive mode and/or conventional ICE drive mode). When the engine is switched on, the driver demanded power is supplied from the engine and the power required from traction motors reduced. This mitigation action may override the user selection of certain electrically-heavy drive modes (e.g., economy drive mode). This in turn reduces the current passing through the high voltage EDS.

According to a twelfth example mitigation action, the EDS protection algorithm includes reducing the load on supplemental electric machines such as those found in electric all-wheel drive (AWD) systems. In an electric AWD system the mitigation action may be implemented by either partially or fully disabling the auxiliary electric machines. Thus, the current passed through the high voltage EDS can be reduced.

According to a thirteenth example mitigation action, the EDS protection algorithm includes reducing the vehicle electrical auxiliary loads on the electrical bus such as vehicle air conditioner and heater. If the electric air conditioner or heater is deactivated, the electrical load supplied to the bus connected to this equipment could be reduced. This would in turn reduce the current delivered from the battery to the particular bus at the cost of passenger comfort.

According to a fourteenth example mitigation action, the EDS protection algorithm includes reducing the charging rate when the vehicle is being charged (e.g., PHEVs and BEVs). In case of a PHEV and/or BEV, the high voltage battery recharging rate could be reduced to decrease the current passing through the charging EDS.

According to a fifteenth example mitigation action, the EDS protection algorithm includes reducing the DC-DC converter output to vehicle auxiliary loads. As discussed above, the DC-DC converter adjusts high voltage DC currents to low voltage DC currents to supply the lower voltage auxiliary loads. If certain portions of the EDS are at the risk of permanent damage, this mitigation action may be implemented such that load supplied to this DC-DC converter is reduced. This in turn reduces current passing through the EDS. In at least one example, the vehicle controller is programmed to reduce vehicle electrical auxiliary loads in response to detection of an overcurrent or an over temperature condition.

According to a sixteenth example mitigation action, the EDS protection algorithm includes limiting power supplied to external devices. In some examples the vehicle may be configured to supply power to external electrical machines using low voltage or high voltage batteries and an inverter system. Under this scenario, the mitigation action includes monitoring whether the current and/or temperature on the EDS is approaching the current threshold or temperature threshold. In response, the mitigation action includes reducing or halting power supply to the external device with sufficient warning to reduce the current carrying in the EDS.

Any combination of the above mitigation actions could be enabled using algorithms of the algorithms provided in the present disclosure. The mitigation selection algorithm includes selection of the optimum combination of mitigation actions to yield the best efficacy to protect particular components at risk of electrical damage. While a list of certain mitigation actions is presented herein by way of example, it is envisioned that other electrical flow-reducing actions may be implemented either alone or in combination with those discussed above to achieve the effect of protecting EDS components at risk of damage.

Any of the mitigation actions may further be modified to alter the efficacy and/or functional effect of the particular action. Referring to FIG. 3, method 300 represents a first mitigation action modifier subroutine. According to the example, a basic on/off switch approach is employed to start or stop a particular set of implemented mitigation actions. At step 302, one or more mitigation actions ($MA_n$) is enabled. At step 304 the subroutine includes detection of the presence of a modifying condition. If no modifying condition is detected at step 304 (as indicated by a zero response in the example flowchart of FIG. 3), the standard mitigation action is implemented without modification at step 306.

If at step 304 the modifying condition is detected, the first mitigation action modifier subroutine includes shifting the mitigation action command according to a predetermined scalar value. For example, in response to the detection of an EDS current greater than a predetermined threshold, the engine pull-up limit of the third mitigation action discussed above may be reduced by a predetermined scalar value. According to a more specific example, the threshold driver demanded power at which the engine is pulled up may be reduced by 50% causing the engine to supplement propulsion for longer durations thus reducing current flow through the EDS. At step 308, the mitigation action is modified according to a predetermined scalar shift. At step 310, the modified mitigation action command is transmitted to the vehicle system controller.

Referring to FIG. 4, a method 400 represents a second mitigation action modifier subroutine that employs a variable command multiplier. According to the example, a lookup table may be stored in memory and contain a plurality of multiplier values to be applied to the mitigation action in response to certain vehicle conditions. At step 402, one or more mitigation actions ($MA_n$) is enabled. At step 404 the subroutine includes detection of the presence of a modifying condition. If no modifying condition is detected at step 404 (as indicated by a zero response in the example flowchart of FIG. 4), the standard mitigation action is implemented without modification at step 406.

If at step 404 the modifying condition is detected, the algorithm includes at step 408 sensing a temperature associated with a fault location. At step 410 the algorithm includes calculating a gain multiplication value based on the sensed temperature value using a gain selection lookup table stored in memory. At step 412 the algorithm includes looking up a baseline mitigation action value associated with the enabled mitigation action $MA_n$. At step 414, the algorithm includes multiplying the baseline mitigation action table value by the calculated gain value. At step 416, the modified mitigation action command is transmitted to the vehicle system controller.

Referring to FIG. 5, a method 500 represents a third mitigation action modifier subroutine that employs multiple tables to employ a variable command multiplier. A plurality of tables may be stored in memory, and be applied individually to each mitigation action in response to certain vehicle conditions. According to one example, a fully enabled table is stored, and a derated table is stored corresponding to a reduced performance table. In the context of the present disclosure, derating refers to the operation of a device at less than a rated maximum electrical capacity in order to prolong its life and avoid damage. The derated table may include derating curves that reduce power limits as a function of temperature. For any of the components of the EDS, the controller may store derated operation ratings to maintain operation of critical components while mitigating the risk of damage due to overcurrent. At step 502, one or more mitigation actions ($MA_n$) is enabled. At step 504 the subroutine includes detection of the presence of a modifying condition. If no modifying condition is detected at step 504 (as indicated by a zero response in the example flowchart of FIG. 5), the standard mitigation action is implemented without modification at step 506.

If at step 504 the modifying condition is detected, the algorithm includes at step 508 includes sensing a temperature associated with a fault location. At step 510 the algorithm includes normalizing temperature readings received from one or more locations in the EDS. In some examples the data transmitted directly from a thermocouple is normalized by generating an RMS value from the raw data. In other examples, the data may be normalized by filtering out certain fluctuations or peaks in the temperature data set.

At step 512 the algorithm includes interpolating between baseline lookup table for mitigation action values associated with the enabled mitigation action $MA_n$, and a derated table associated with reduced output. The algorithm may include a range of reduced performance associated with the mitigation action, from fully derated to unmodified baseline performance.

At step 514 a gain the algorithm includes calculating the gain multiplication value based on the sensed temperature value, combined with the interpolation between the baseline performance and derated performance of one or more components. At step 516, the algorithm includes multiplying the baseline mitigation action table value by the calculated gain value which may include a selected degree of derated performance. At step 518, the modified mitigation action command is transmitted to the vehicle system controller. According to some examples, the vehicle controller is programmed to apply the gain multiplication value to the mitigation action based on a derated operation of a selected component in the EDS.

Figure 6:
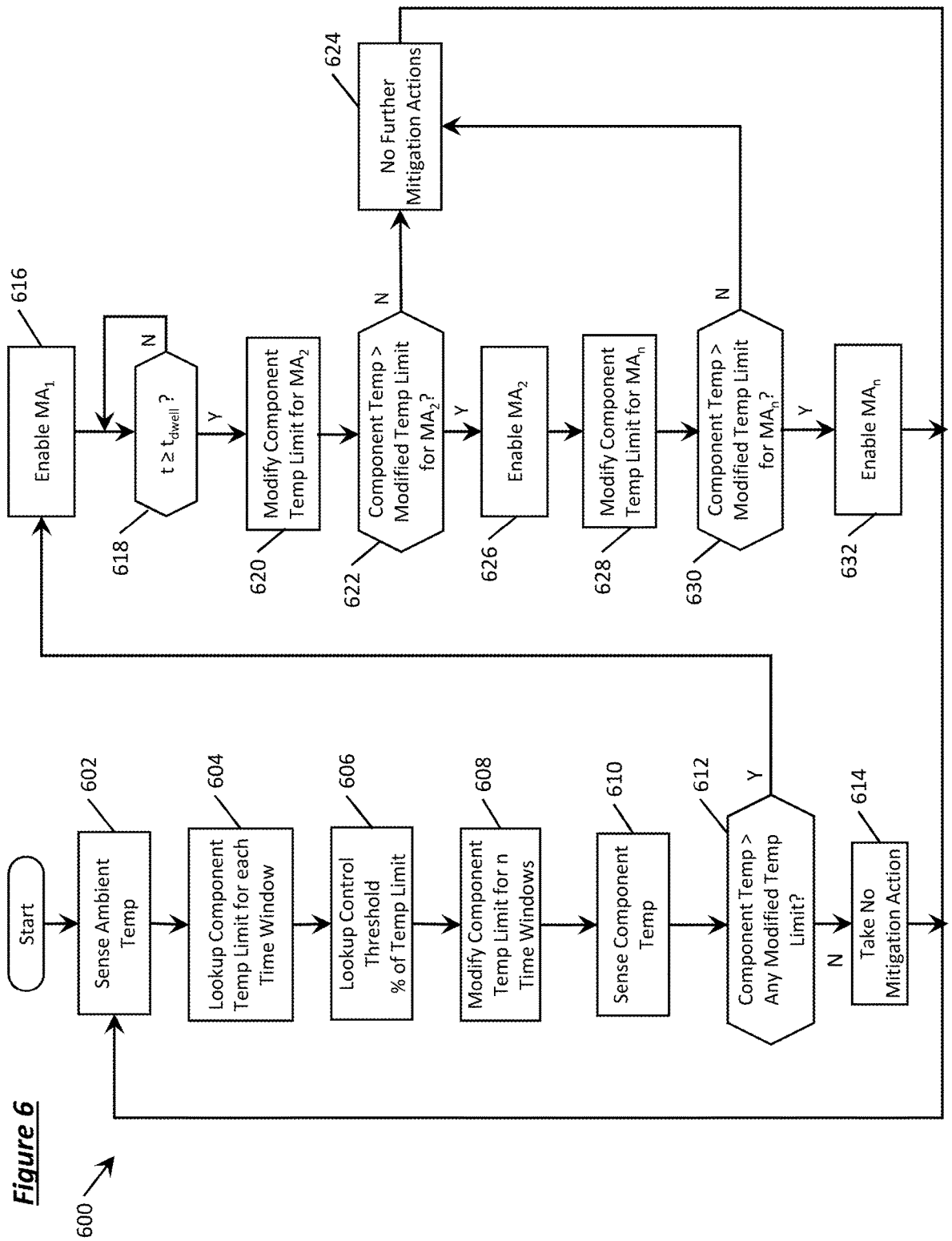
FIG. 6 is a flowchart of an electrical mitigating action selection algorithm having a single time window.

Referring to FIG. 6, an algorithm flowchart depicting method 600 is provided. According to some aspects, method 600 may be part of a sequential layering subroutine of mitigation actions while applying a single predetermined time window. A set of mitigation actions may be applied sequentially to manage EDS electrical disturbances. At step 602 the algorithm includes sensing an ambient temperature in a proximity of the EDS. At step 604 the algorithm includes calculating a component temperature limit based on a predetermined component protection threshold. According to some examples, the algorithm includes looking up the component temperature limit in a lookup table stored in memory. At step 606 the algorithm includes calculating a control threshold by which to modify the component temperature limit. According to further examples, the control threshold is a percentage of the component limit at which the mitigation action should be activated. At step 608 the component temperature limit is modified based on the control threshold percentage. Thus, the current carrying capability of the EDS may be based on one or more current-limiting components within the EDS. And, as discussed in more detail below, the selection of the current-limiting component may be conducted real-time and vary based on particular time windows of monitoring, location in the EDS, or other operating conditions.

At step 610 the algorithm includes sensing the temperature at one or more EDS components. As discussed above, the component temperature may be used directly (e.g., as provided directly from a thermocouple signal), or normalized temperature values may be employed. At step 612 the algorithm includes comparing whether the sensed component temperature has exceeded the modified component temperature limit. If the component temperature is less than the modified limit at step 612 the algorithm includes taking no mitigation action at step 614 and continuing to monitor temperature at one or more locations in the EDS.

If at step 612 the sensed component temperature has exceeded the modified component temperature limit, a first mitigation action $MA_1$ is enabled at step 616. It should be appreciated that each different mitigation action may have a unique associated temperature and/or current limit at which that particular mitigation action is enabled. At step 618 the algorithm includes holding for a time duration $t_{dwell}$ to assess efficacy of the first mitigation action $MA_1$. Once the time duration $t_{dwell}$ has elapsed, the algorithm includes assessing whether a second mitigation action is required in addition to the first mitigation action $MA_1$.

At step 620 the algorithm includes modifying the component temperature limit associated with the second mitigation action $MA_2$. At step 622 the algorithm includes assessing whether the sensed component temperature exceeds the modified component temperature limit at which the second mitigation action $MA_2$ is engaged. If at step 622 the sensed component temperature is less than the modified component temperature limit associated with the second mitigation action $MA_2$, the algorithm includes taking no further mitigation actions at step 624. In practice, this scenario may correspond to a high efficacy of the first mitigation action such that only one mitigation action is necessary to manage temperature in the EDS.

If at step 622 the sensed component temperature is greater than the modified component temperature limit associated with the second mitigation action $MA_2$, the algorithm includes enabling the second mitigation action $MA_2$ at step 626.

In similar fashion, the algorithm may include continued layering of any number of mitigation actions to combine their effects such that the overall efficacy results in the desired temperature and/or current regulation of the EDS. At step 628 the algorithm includes modifying the component temperature limit associated with the "nth" mitigation action $MA_n$, where n may represent any number of overall mitigation actions. At step 630 the algorithm includes assessing whether the sensed component temperature exceeds the modified component temperature limit at which the nth mitigation action $MA_n$ is engaged. If at step 630 the sensed component temperature is less than the modified component temperature limit associated with the nth mitigation action $MA_n$, the algorithm includes taking no further mitigation actions at step 624. If at step 630 the sensed component temperature is greater than the modified component temperature limit associated with the nth mitigation action $MA_n$, the algorithm includes enabling the nth mitigation action $MA_n$ at step 632. According to some examples, the algorithm includes a dwell time after enabling a mitigation action prior to enabling a subsequent mitigation action.

Figure 7:
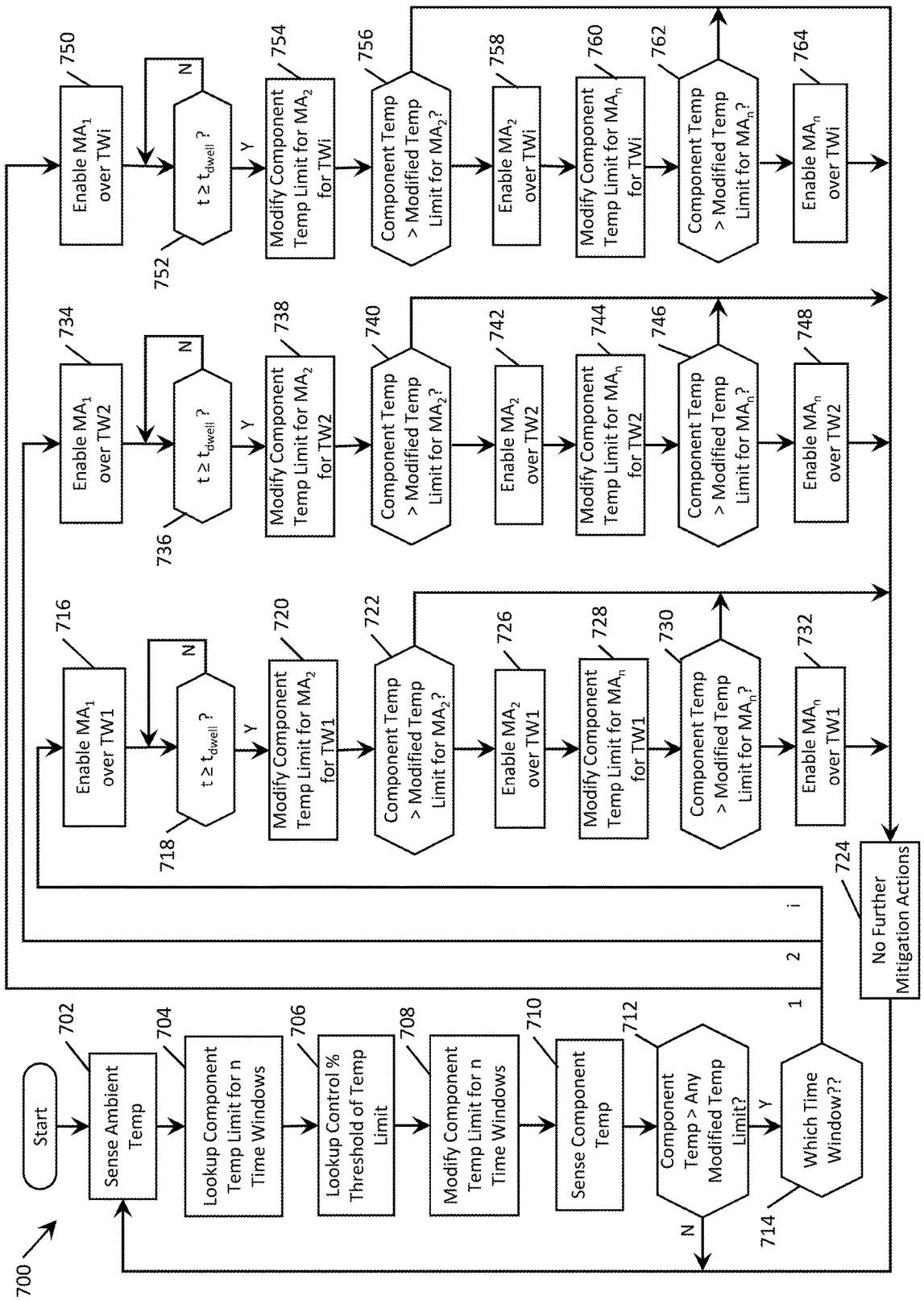
FIG. 7 is a flowchart of an electrical mitigating action selection algorithm having multiple time windows.

Referring to FIG. 7, an algorithm flowchart depicting method 700 is provided. According to some aspects, method 700 may be part of a second sequential layering subroutine of mitigation actions which may employ any of multiple different time windows. The various time windows may be selected and applied differently based on operating conditions and/or the particular component sensed with a present or impending current fault. Once a time window is selected, a particular set of mitigation actions is employed similar to the previous example of method 600 described above. According to some examples, the time window is selected based on at least one of a sensed current magnitude, a sensed current rate of change, a temperature magnitude, a temperature rate of change, and the criticality of a monitored component.

At step 702 the algorithm includes sensing an ambient temperature in a proximity of the EDS. At step 704 the algorithm includes calculating a component temperature limit based on a predetermined component protection threshold. According to some examples, the algorithm includes looking up the component temperature limit in a lookup table stored in memory. At step 706 the algorithm includes calculating a control threshold by which to modify the component temperature limit. According to some examples, the control threshold is a percentage of the component limit at which the mitigation action should be activated. At step 708 the component temperature limit is modified based on the control threshold percentage. Thus, the current carrying capability of any portion of the EDS may be based on one or more current-limiting components within the EDS. The selection of the current-limiting component and associated limit may be conducted real-time and vary based on particular time windows of monitoring, location in the EDS, or other operating conditions.

At step 710 the algorithm includes sensing the temperature at one or more EDS components. As discussed above, the component temperature may be used directly (e.g., as provided directly from a thermocouple signal), or normalized temperature values may be employed. At step 712 the algorithm includes comparing whether the sensed component temperature has exceeded the modified component temperature limit. If the component temperature is less than the modified limit at step 712 the algorithm includes taking no mitigation action and returning to step 702 to continue to monitor temperature and/or current at one or more selected locations in the EDS.

If at step 712 sensed component temperature is greater than the modified component temperature limit, the algorithm includes selection of a time window over which to apply one or more mitigation actions. The selected amount of time over which the mitigation action is enabled may be based on a sensed current amplitude able to be accepted by the particular branch of the EDS. In a specific example, higher component temperature and/or electrical thresholds may correspond to the application of shorter duration time windows over which to apply more aggressive mitigation actions. Conversely, longer time windows may be selected corresponding to lower component temperature and/or electrical thresholds allowed in a particular branch of the EDS. In other examples, a longer time window mitigation action may be applied for slower rising current conditions, and shorter time window mitigation actions may be applied for more rapidly rising current conditions.

If at step 714 a first time window $TW_1$ is selected, the algorithm a first mitigation action $MA_1$ is enabled over the first time window at step 716. It should be appreciated that each different mitigation action may have a unique associated temperature limit at which that particular mitigation action is enabled. At step 718 the algorithm includes holding for a time duration $t_{dwell}$ to assess efficacy of the first mitigation action $MA_1$. Once the time duration $t_{dwell}$ has elapsed, the algorithm includes assessing whether a second mitigation action is required in addition to the first mitigation action $MA_1$.

At step 720 the algorithm includes modifying the component temperature limit associated with the second mitigation action $MA_2$. At step 722 the algorithm includes assessing whether the sensed component temperature exceeds the modified component temperature limit at which the second mitigation action $MA_2$ is engaged. If at step 722 the sensed component temperature is less than the modified component temperature limit associated with the second mitigation action $MA_2$, the algorithm includes taking no further mitigation actions at step 724. In practice, this scenario may correspond to a high efficacy of the first mitigation action such that only one mitigation action is necessary to manage temperature in the EDS.

If at step 722 the sensed component temperature is greater than the modified component temperature limit associated with the second mitigation action $MA_2$, the algorithm includes enabling the second mitigation action $MA_2$ at step 726.

In similar fashion, the algorithm may include continued layering of any number of mitigation actions to combine their effects such that the overall efficacy results in the desired temperature regulation of the EDS. At step 728 the algorithm includes modifying the component temperature limit associated with the nth mitigation action $MA_n$, where n may represent any number of overall mitigation actions. At step 730 the algorithm includes assessing whether the sensed component temperature exceeds the modified component temperature limit at which the nth mitigation action $MA_n$ is engaged. If at step 730 the sensed component temperature is less than the modified component temperature limit associated with the nth mitigation action $MA_n$, the algorithm includes taking no further mitigation actions at step 724. If at step 730 the sensed component temperature is greater than the modified component temperature limit associated with the nth mitigation action $MA_n$, the algorithm includes enabling the nth mitigation action $MA_n$ at step 732. According to some examples, the algorithm includes a dwell time after enabling a mitigation action prior to enabling a subsequent mitigation action.

If at step 714 a second time window $TW_2$ is selected in response to magnitude of the sensed current and/or temperature, a first mitigation action $MA_1$ is enabled over the second time window $TW_2$ at step 734. It should be appreciated that each different mitigation action may have a unique associated temperature limit at which that particular mitigation action is enabled for a given time window. At step 736 the algorithm includes holding for a time duration $t_{dwell}$ to assess efficacy of the first mitigation action $MA_1$. Once the time duration $t_{dwell}$ has elapsed, the algorithm includes assessing whether a second mitigation action is required in addition to the first mitigation action $MA_1$.

At step 738 the algorithm includes modifying the component temperature limit associated with the second mitigation action $MA_2$ for the second time window $TW_2$. At step 740 the algorithm includes assessing whether the sensed component temperature exceeds the modified component temperature limit at which the second mitigation action $MA_2$ is engaged. If at step 740 the sensed component temperature is less than the modified component temperature limit associated with the second mitigation action $MA_2$, the algorithm includes taking no further mitigation actions at step 724. In practice, this scenario may correspond to a high efficacy of the first mitigation action such that only one mitigation action is necessary to manage temperature in the EDS.

If at step 740 the sensed component temperature is greater than the modified component temperature limit associated with the second mitigation action $MA_2$, the algorithm includes enabling the second mitigation action $MA_2$ at step 742.

In similar fashion, the algorithm may include continued layering of any number of mitigation actions for a given selected time window to combine their effects to achieve the desired temperature regulation of the EDS. At step 742 the algorithm includes modifying the component temperature limit associated with the nth mitigation action $MA_n$ for the second time window $TW_2$, where n may represent any number of overall mitigation actions. At step 746 the algorithm includes assessing whether the sensed component temperature exceeds the modified component temperature limit at which the nth mitigation action $MA_n$ is engaged. If at step 746 the sensed component temperature is less than the modified component temperature limit associated with the nth mitigation action $MA_n$, the algorithm includes taking no further mitigation actions at step 724. If at step 746 the sensed component temperature is greater than the modified component temperature limit associated with the nth mitigation action $MA_n$, the algorithm includes enabling the nth mitigation action $MA_n$ over the second time window $TW_2$ at step 748.

Any of a plurality of time window durations may be selected based on the sensed current and/or temperature at a selected monitoring location in the EDS. If at step 714 the "ith" time window is selected, the algorithm includes assessing mitigation actions over a time window i, $TW_i$. Similar to previous examples, the subroutine associated with time window i, $TW_i$, may include a sequential layering of any number of mitigating actions.

Once time window i, $TW_i$ is selected in response to magnitude of the sensed current and/or temperature, a first mitigation action $MA_1$ is enabled over the time window $TW_i$ at step 750. It should be appreciated that each different mitigation action may have a unique associated temperature limit at which that particular mitigation action is enabled for a given time window. At step 752 the algorithm includes holding for a time duration $t_{dwell}$ to assess efficacy of the first mitigation action $MA_1$. Once the time duration $t_{dwell}$ has elapsed, the algorithm includes assessing whether a second mitigation action is required in addition to the first mitigation action $MA_1$.

At step 754 the algorithm includes modifying the component temperature limit associated with the second mitigation action $MA_2$ for the time window i, $TW_i$. At step 756 the algorithm includes assessing whether the sensed component temperature exceeds the modified component temperature limit at which the second mitigation action $MA_2$ is engaged. If at step 756 the sensed component temperature is less than the modified component temperature limit associated with the second mitigation action $MA_2$, the algorithm includes taking no further mitigation actions at step 724.

If at step 756 the sensed component temperature is greater than the modified component temperature limit associated with the second mitigation action $MA_2$, the algorithm includes enabling the second mitigation action $MA_2$ at step 758.

In similar fashion, the algorithm may include continued layering of any number of mitigation actions for the selected time window i, $TW_i$, to combine their effects to achieve the desired temperature regulation of the EDS. At step 760 the algorithm includes modifying the component temperature limit associated with the nth mitigation action $MA_n$, for the time window i, $TW_i$, where n may represent any number of overall mitigation actions. At step 762 the algorithm includes assessing whether the sensed component temperature exceeds the modified component temperature limit at which the nth mitigation action $MA_n$ is engaged. If at step 762 the sensed component temperature is less than the modified component temperature limit associated with the nth mitigation action $MA_n$, the algorithm includes taking no further mitigation actions at step 724. If at step 762 the sensed component temperature is greater than the modified component temperature limit associated with the nth mitigation action $MA_n$, the algorithm includes enabling the nth mitigation action $MA_n$ over the time window i, $TW_i$, at step 764.

Figure 8:
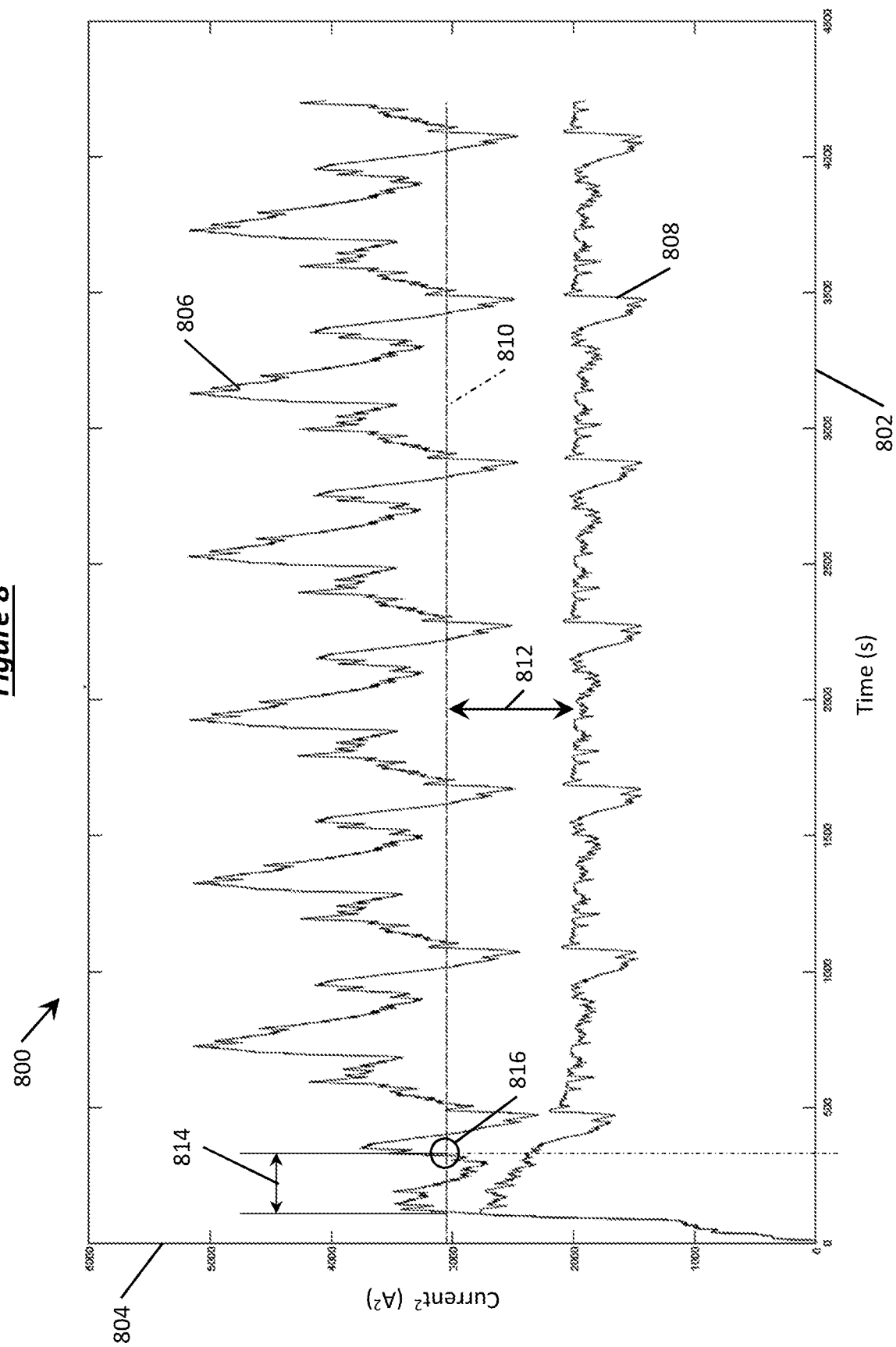
FIG. 8 is a current versus time plot depicting a first electrical mitigating action strategy.

FIG. 8 includes plot 800 which depicts performance results of applying one or more algorithms disclosed herein. According to one example, plot 800 corresponds to the application of a selected set of mitigation actions over a single time window. Plot 800 shows the current drawn through a monitored component as the vehicle is driven through a series of vehicle drive cycles. The example drive cycles are a representation of aggressive, high speed and/or high acceleration driving behavior, rapid speed fluctuations, and driving behavior following startup. While this particular test cycle is used as an example representation of the effect of the algorithms of the present disclosure, it should be understood that EDS mitigation strategies remain effective to protect EDS components in myriad vehicle use cases.

Horizontal axis 802 represents time in seconds. Vertical axis 804 represents filtered current in Amperes squared. Curve 806 represents the current passing through a monitored component without applying the EDS mitigations strategies discussed herein. Curve 808 represents current passing through the same monitored component while applying a set of one or more mitigations actions. The current is estimated in this example from the filtered raw data current readings. In the specific example of plot 800, four of the sixteen mitigation actions discussed above were applied to regulate system current.

Curve 810 represents the current limit of the monitored component. For example, if the monitored component is rated to tolerate 55 A for 300 s, the mitigation strategy may apply a current limit of curve 810 of 3,025 $A^2$. Also, a control percentage threshold 812 of about 66% of the of the current limit 810 is applied to maintain current draw across the monitored component at about 2,000 $A^2$ during the drive cycle test.

According to the FIG. 8 example, the selected time window 814 over which the mitigation action is applied is 300 seconds. The shorter window may be selected based on the rapid initial increase in current flow to improve system responsiveness and avoid damage to the monitored EDS component.

It can be seen from curve 806 of plot 800 that without applying the mitigation strategy, current drawn across the monitored component begins to regularly exceed the current limit 810 in cyclical fashion beginning at about critical region 816. Notably, this critical region 816 may be based on the intersection of the current limit 810 and the conclusion of the applied time window 814. The mitigation systems and methods presented herein allow the monitored component to perform during aggressive drive cycles without incurring electrical damage due to high current.

Figure 9:
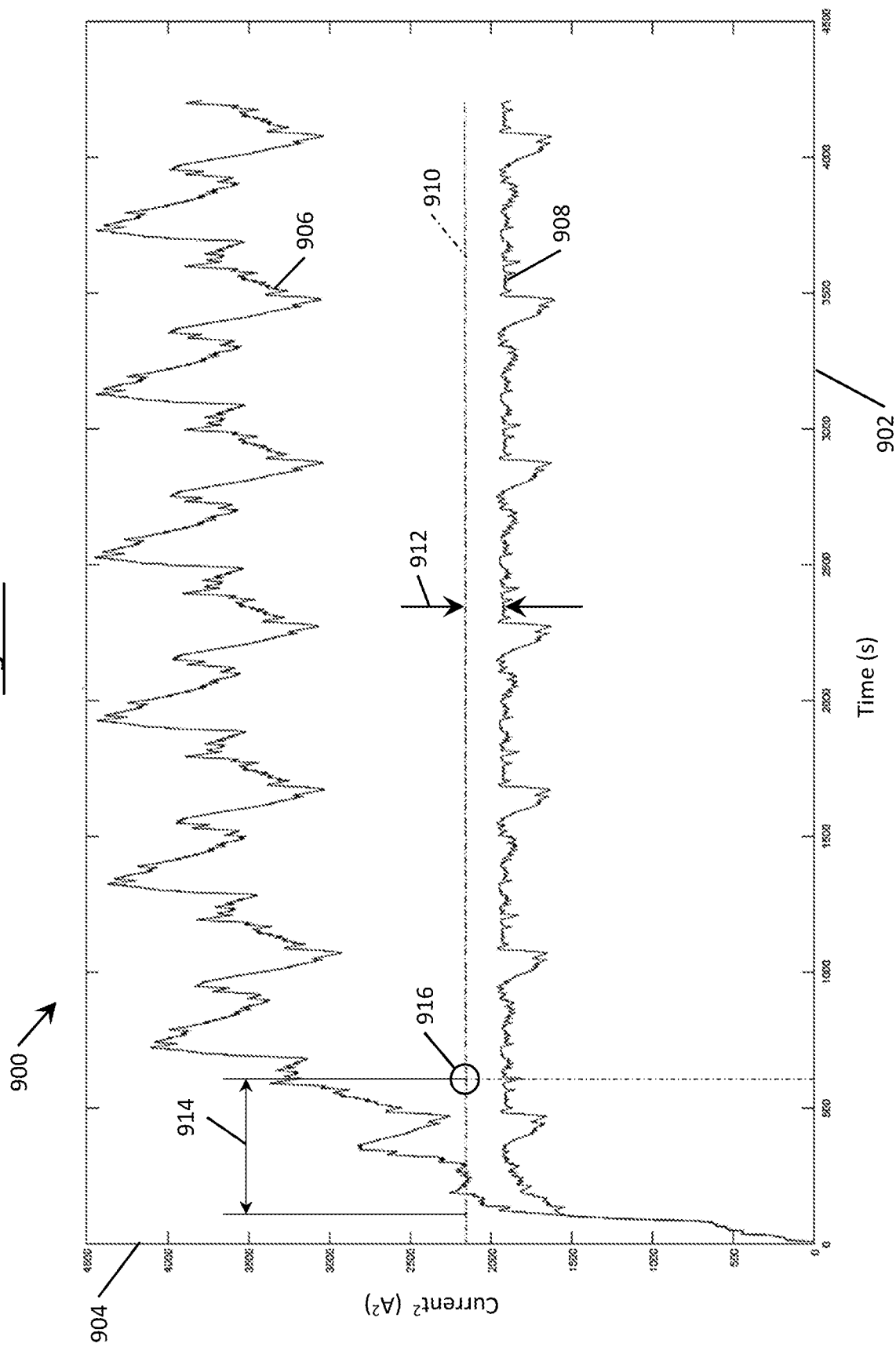
FIG. 9 is a current versus time plot depicting a second electrical mitigating action strategy.
Figure 10:
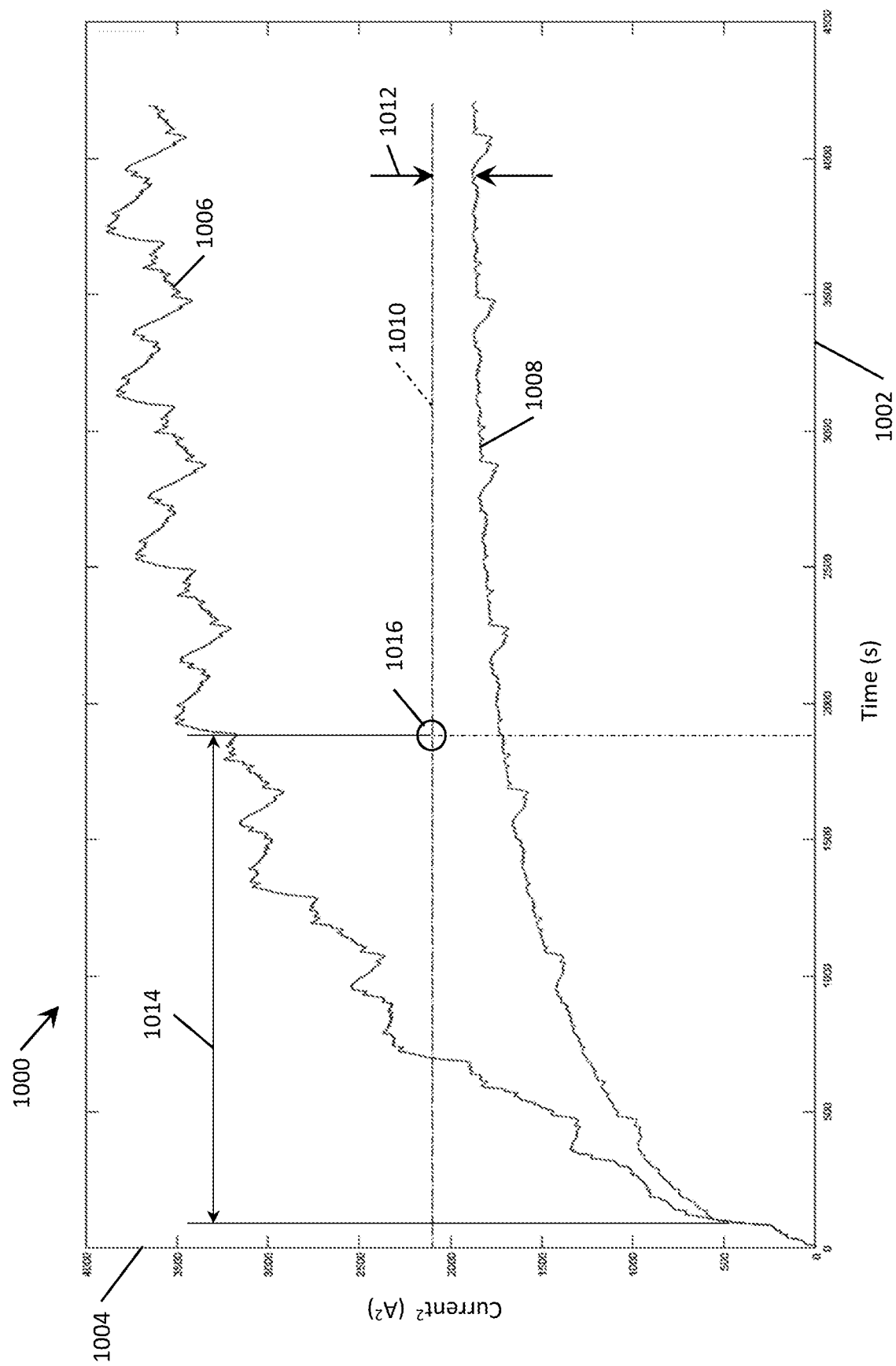
FIG. 10 is a current versus time plot depicting a third electrical mitigating action strategy.
Figure 11:
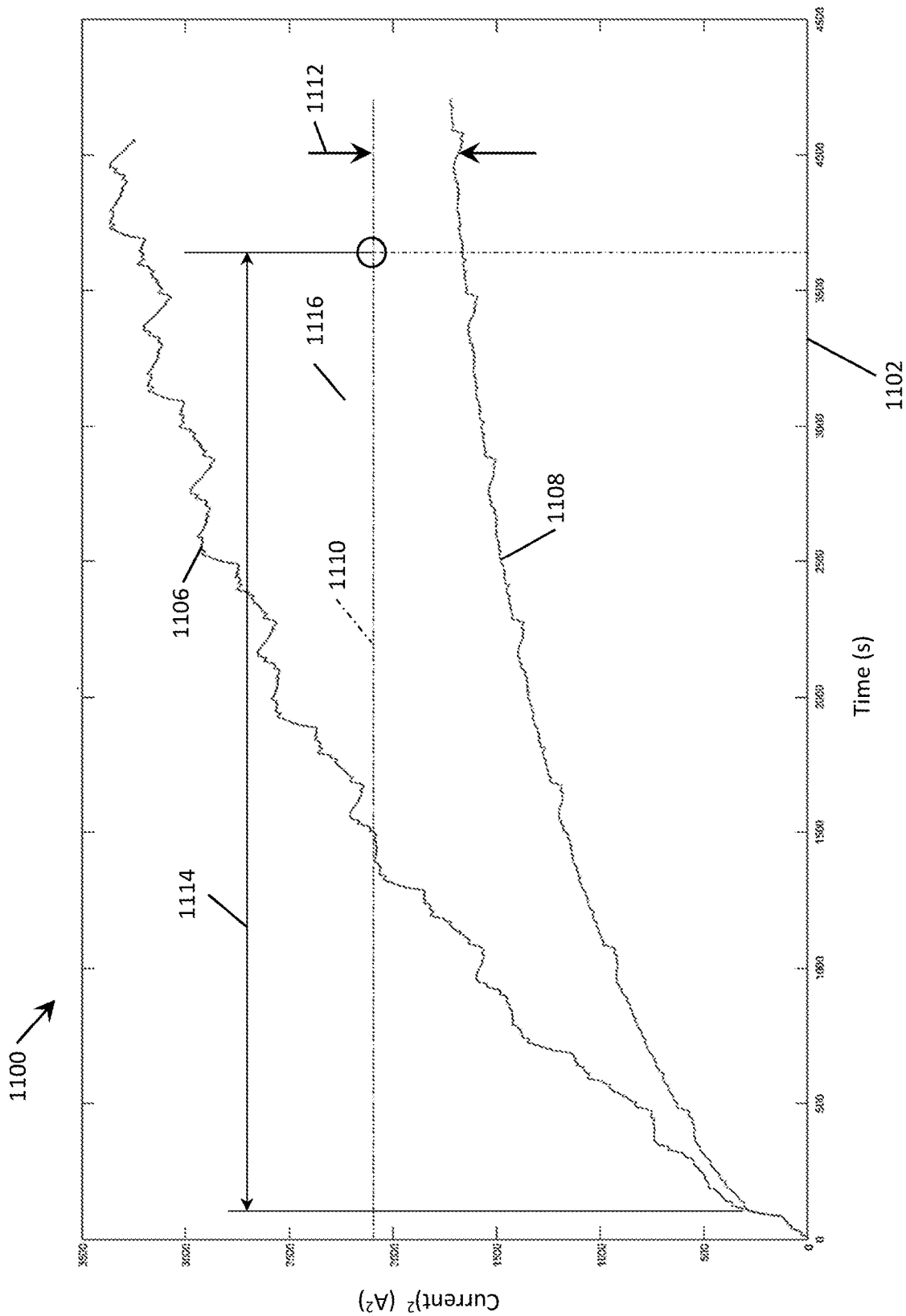
FIG. 11 is a current versus time plot depicting a fourth electrical mitigating action strategy.

FIGS. 9 through 11 represent additional examples of combination of temperature and/or current calculation, mitigation action selection, time window selection, and threshold arbitration via a control percentage.

Referring to FIG. 9 depicts performance results of applying one or more mitigation algorithms. Plot 900 also corresponds to the application of a selected set of mitigation actions over a single time window. Comparatively, a longer time window of 600 s is applied to regulate current at the monitored component. Plot 900 also shows the current drawn through the monitored component during one or more drive cycles. Similar to the above example, horizontal axis 902 represents time in seconds, and vertical axis 904 represents filtered current in Amperes squared. Curve 906 represents the current passing through the monitored component without applying the EDS mitigations strategies discussed herein. Curve 908 represents current passing through the same monitored component while applying a selected set of four mitigations actions to regulate system current. Current at the monitored component is estimated from the filtered raw data current readings.

Curve 910 represents the current limit of the monitored component. For example, if the monitored component is rated to tolerate 46 A for 600 s, the mitigation strategy may apply a current limit of curve 910 of 2,100 $A^2$. Also, a control percentage threshold 912 of about 90% of the of the current limit 910 is applied to maintain current draw across the monitored component less than about 2,000 $A^2$ throughout the drive cycle test.

The time window 914 over which the mitigation action is applied is 600 seconds. Relative to plot 800, a longer time window 914 may be suitable in the case of a more gradual initial increase in current flow at the beginning of the cycle.

It can be seen from curve 906 of plot 900 that without applying the mitigation strategy, current drawn across the monitored component begins to cycle with a stable average value well above the current limit 910 beginning at about critical region 916. Notably, this critical region 916 may be based on the intersection of the current limit 910 and the conclusion of the applied time window 914. The mitigation systems and methods presented herein allow the monitored component to perform during the aggressive drive cycles without incurring electrical damage due to high current.

FIG. 10 includes plot 1000 which depicts results of applying a set of mitigation action algorithms as discussed above. Plot 1000 also corresponds to the application of a selected set of mitigation actions over a single time window. Comparatively, an even longer time window of 1,800 s is applied to regulate current at the monitored component. Similar to the above examples, plot 1000 also shows the current drawn through the monitored component during one or more drive cycles. Horizontal axis 1002 represents time in seconds, and vertical axis 1004 represents filtered current in Amperes squared. Curve 1006 represents the current passing through the monitored component without applying the EDS mitigations strategies discussed herein. Curve 1008 represents current passing through the same monitored component while applying a selected set of four mitigations actions to regulate system current. Current at the monitored component is estimated from the filtered raw data current readings.

Curve 1010 represents the current limit of the monitored component. For example, if the monitored component is rated to tolerate 46 A for a duration of 1,800 s, the mitigation strategy may apply a current limit of curve 1010 of about 2,100 $A^2$. Also, a control percentage threshold 1012 of about 90% of the of the current limit 1010 is applied to maintain current draw across the monitored component less than about 2,000 $A^2$ throughout the drive cycle test.

The time window 1014 over which the mitigation action is applied is much longer relative to previous examples at 300 and 600 seconds. Relative to plot 800, a longer time window 914 may be suitable in the case of a component which carries lower current and gradually accumulates heat over a long period of time with lower risk of short-term damage. Additionally, increased duration time windows may be applied to manage electrical flow for other components.

It can be seen from curve 1006 of plot 1000 that without applying the mitigation strategy, current drawn across the monitored component significantly exceeds the rated electrical limits. The mitigation systems and methods presented herein allow the monitored component to perform during one or more aggressive drive cycles without incurring electrical damage due to high current. The EDS mitigation system enables mitigation actions which decrease the current to a level set by the threshold limits.

FIG. 11 includes plot 1100 which depicts results of applying a set of mitigation action algorithms as discussed above. Plot 1100 also corresponds to the application of a selected set of mitigation actions over a single time window. Comparatively, an even longer still time window of 3,800 s is applied to regulate current at the monitored component. Similar to the above examples, plot 1100 also shows the current drawn through the monitored component during the US06 cycle test. Horizontal axis 1102 represents time in seconds, and vertical axis 1104 represents filtered current in Amperes squared. Curve 1106 represents the current passing through the monitored component without applying the EDS mitigations strategies discussed herein. Curve 1108 represents current passing through the same monitored component while applying a selected set of four mitigations actions to regulate system current. Current at the monitored component is estimated from the filtered raw data current readings.

Curve 1110 represents the current limit of the monitored component. For example, if the monitored component is rated to tolerate 46 A for a longer duration of 3,600 s, the mitigation strategy may apply a current limit of curve 1110 of about 2,100 $A^2$. Also, a control percentage threshold 1112 of about 90% of the of the current limit 1110 is applied to maintain current draw across the monitored component less than about 2,000 $A^2$ throughout the aggressive drive cycles.

The time window 1114 over which the mitigation action is applied is much longer at 3,800 seconds relative to previous examples of 300 s, 600 s, and 1,800 s. Relative to plot 800, a longer time window 1114 may be suitable in the case of a component which carries a lower current and gradually accumulates heat over a longer period of time with lower risk of short-term damage. It should be appreciated that increased time window durations may be suitable other components as well.

It can be seen from curve 1106 of plot 1100 that without applying the mitigation strategy, current drawn across the monitored component significantly exceeds the rated electrical limits. The mitigation systems and methods presented herein allow the monitored component to perform during aggressive drive cycles without incurring electrical damage due to high current. The EDS component mitigation system enables mitigation actions which decrease the current at one or more monitored locations to a level set by the threshold limits.

Mitigation actions for shorter time windows may be started early (i.e., aggressive mitigation) due to the time lag of temperature and/or current reduction effects, whereas mitigation actions for longer time windows may be implemented with later start times (i.e., moderate mitigation).

Figure 12:
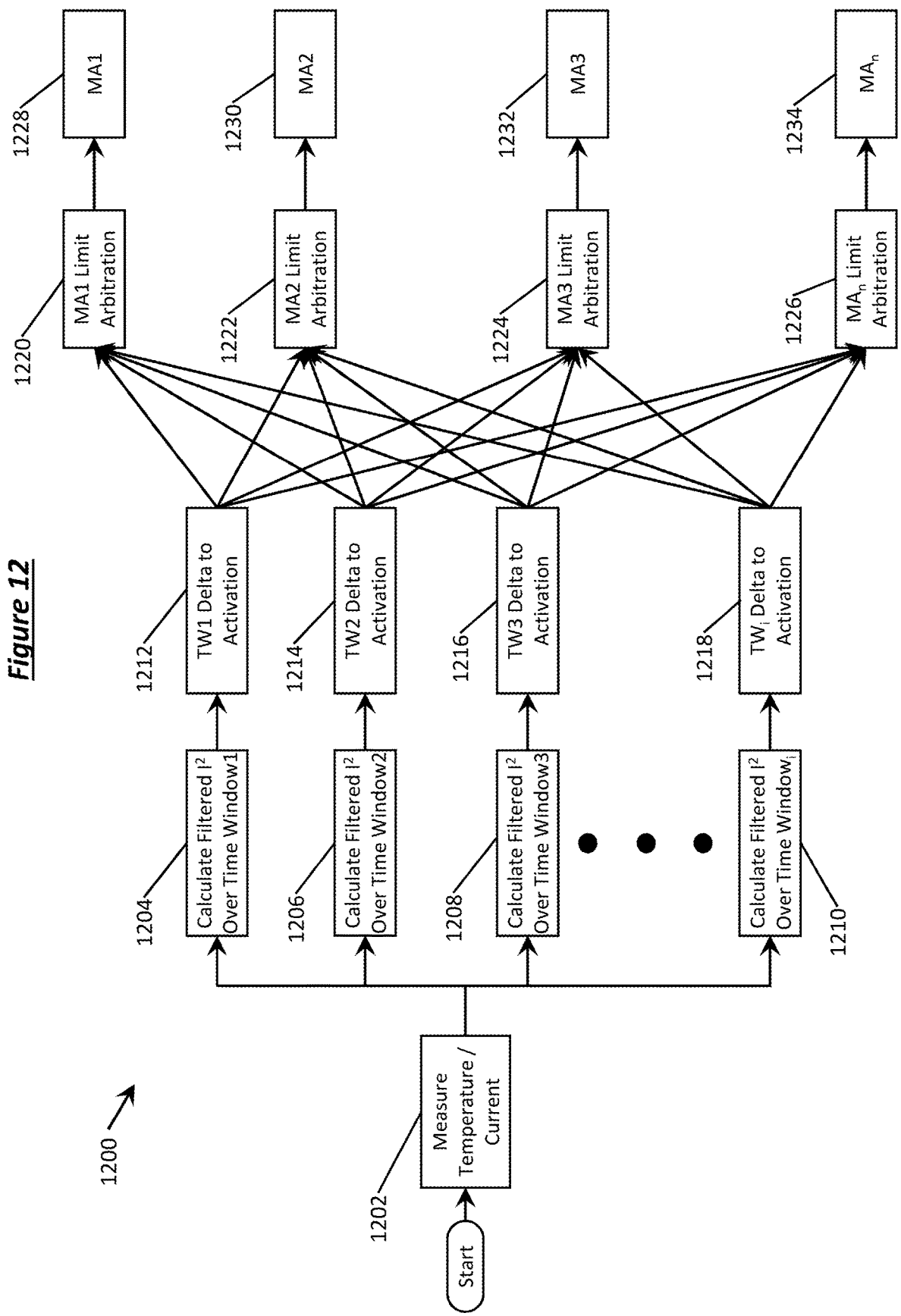
FIG. 12 is a flowchart of an algorithm to apply multiple time windows to manage current flow.

Referring to FIG. 12, flowchart 1200 is a method of applying multiple time windows simultaneously to manage current flow in the EDS. At step 1202, current flow and/or temperature is measured at a selected EDS component. According to at least one example, current draw from the traction battery is measured at step 1202.

At step 1204, the measured current value is squared then filtered for a first time window TW1. At step 1206, the current value is squared and filtered for a second time window TW2. Similarly, at step 1208 the current value is squared and filtered for a third time window TW3. The measured current value is squared and filtered for any number i of time windows until the last calculation is performed at step 1210 for the "ith" time window $TW_i$. It is contemplated that the calculation of filtered current squared may be performed simultaneously for a plurality of different time windows.

At step 1212, a delta to the activation current threshold is calculated for time window TW1. Likewise, at steps 1214, 1216, and 1218 a delta to the activation current threshold is calculated for each of time windows TW2, TW3, through $TW_i$, respectively. Each of the individual delta values to an activation current threshold for given time window may trigger any of the set of mitigation actions with a unique implementation timing. As discussed in previous examples, any combination of a set of mitigation actions MA1, MA2, MA3, through $MA_n$ may be implemented in response to the detection of an overcurrent condition. Stated another way, each time window calculation carries the potential to trigger any or all of the available mitigation actions based on the weakest link component for that particular time window.

At steps 1220, 1222, 1224, and 1226, limit arbitration is performed for each of mitigation actions MA1, MA2, MA3, through $MA_n$, respectively. Each of the outputs from the various time windows may trigger a different response timing and unique activation thresholds. As discussed above, earlier-triggered mitigation actions may correspond to aggressive EDS component protection and later-implemented mitigation actions may correspond to more moderate EDS component protection. If any of the respective activation threshold limits are exceeded at steps 1220, 1222, 1224, and 1226, the corresponding mitigation action MA1, MA2, MA3, through $MA_n$, is implemented at steps 1228, 1230, 1232, and 1234.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
   an electrified propulsion system powered by a traction battery over an electrical distribution system (EDS); and
   a controller programmed to implement at least one mitigation action over a predetermined time window in response to detecting a filtered current squared value exceeding a threshold, wherein the at least one mitigation action is selected from a set of mitigation actions corresponding to a location of the detected filtered current squared value within the EDS, the at least one mitigation action being implemented in a sequence with a predetermined time dwell between each of the mitigation actions.

2. The vehicle of claim 1 wherein a duration of the predetermined time window is based on at least one of: a rate of change of a monitored current flow, a current rating of at least one electrical component in the EDS, a selected monitoring location in the EDS, and a magnitude of the monitored current flow.

3. The vehicle of claim 1 further comprising a power interface configured to receive power from an off-board source to charge the traction battery, wherein the at least one mitigation action includes reducing a traction battery charging power limit.

4. The vehicle of claim 1 wherein the at least one mitigation action is performed at a location within the EDS external to the traction battery.

5. The vehicle of claim 1 wherein the detected filtered current squared value exceeding the threshold is external to the traction battery.

6. The vehicle of claim 1 wherein the electrified propulsion system includes a traction motor in cooperation with a combustion engine, and the controller is further programed to limit traction motor output in favor of engine output in response to detecting the at least one of the current flow and the temperature exceeding the threshold.

7. The vehicle of claim 6 wherein the at least one mitigation action comprises a subset of: decreasing an engine pull up threshold, decreasing an engine pull down threshold, decreasing a traction battery discharge power limit, decreasing a traction battery charge power limit, decreasing a regenerative braking power limit, reducing an EV mode maximum driving speed, disabling an EV propulsion mode, and reducing vehicle electrical auxiliary loads.

8. A method of controlling power flow in a vehicle electrical distribution system (EDS) comprising:
   in response to a monitored current exceeding a current limit, enabling a set of mitigation actions to maintain current at a component location corresponding to the monitored current to be less than a control percentage threshold of the current limit, wherein the current limit is selected based on a current carrying capability of the EDS and the set of mitigation actions are enabled in a sequence with a predetermined time dwell between each of the mitigation actions.

9. The method of claim 8 wherein the current limit is based on a derated operation rating of the selected component.

10. The method of claim 8 wherein the set of mitigation actions is enabled over a time window, and the time window is based on at least one of a rate of change and a magnitude of the monitored current.

11. The method of claim 8 wherein the set of mitigation actions comprises a plurality of: decreasing an engine pull up threshold, decreasing an engine pull down threshold, decreasing a traction battery discharge power limit, decreasing a traction battery charge power limit, decreasing a regenerative braking power limit, reducing an EV mode maximum driving speed, disabling traction motor operation, and reducing vehicle electrical auxiliary loads.

12. The method of claim 8 wherein the current carrying capability of the EDS is based on a current-limiting component, and the control percentage threshold is based on at least one of a criticality of the current-limiting component, a location of the current-limiting component in the EDS, and a length of a time window over which the set of mitigation actions is enabled.

13. The method of claim 8 wherein the at least one of a set of a plurality of mitigation actions is enabled at a location within the EDS external to a traction battery.

14. The method of claim 8 wherein the plurality of components monitored within the EDS includes a traction battery, the electric machine, and at least one high-voltage load.

15. A vehicle comprising:
   an electric machine powered over an electrical distribution system (EDS) in cooperation with an engine; and
   a controller programmed to
      cause propulsion of the vehicle using at least one of the electric machine and the engine, and
      in response to sensing at least one of a squared value of filtered current, a root mean squared (RMS) current value, a direct measurement temperature value, and a non-squared filtered current value greater than a threshold, enable at least one of a set of a plurality of mitigation actions in a sequence with a predetermined time dwell between each of the mitigation actions to reduce a power limit at a location along the EDS corresponding to the sensed value greater than the threshold.

16. The vehicle of claim 15 wherein the at least one mitigation action comprises a subset of: decreasing a driver power demand engine pull up threshold, decreasing a driver power demand engine pull down threshold, decreasing a traction battery state of charge (SOC) engine pull up threshold, decreasing a traction SOC engine pull down threshold, decreasing a traction battery discharge power limit, decreasing a traction battery charge power limit, decreasing a regenerative braking power limit, reducing an EV mode maximum driving speed, disabling traction motor operation, and reducing vehicle electrical auxiliary loads.

17. The vehicle of claim 15 wherein the at least one mitigation action is enabled over a time window, and the time window is based on at least one of a rate of change and a magnitude of the monitored current flow.

18. The vehicle of claim 15 wherein the controller is further programmed to apply a gain multiplication value to the mitigation action based on a derated operation of the electric machine.

19. The vehicle of claim 15 wherein the mitigation action includes reducing electric machine output and satisfying a driver demand by increasing engine output.

20. The vehicle of claim 15 wherein the plurality of different locations across the EDS includes a traction battery, the electric machine, and at least one high-voltage load.

* * * * *